United States Patent [19]

Coppersmith et al.

[11] Patent Number: 4,675,650

[45] Date of Patent: Jun. 23, 1987

[54] RUN-LENGTH LIMITED CODE WITHOUT DC LEVEL

[75] Inventors: Don Coppersmith, Ossining; Bruce P. Kitchens, Mount Kisco, both of N.Y.

[73] Assignee: IBM Corporation, Armonk, N.Y.

[21] Appl. No.: 725,954

[22] Filed: Apr. 22, 1985

[51] Int. Cl.[4] ............................................. H03M 7/42
[52] U.S. Cl. ......................... 340/347 DD; 340/347 M; 360/40
[58] Field of Search ............ 340/347 DD; 360/39–41; 375/19

[56] References Cited

U.S. PATENT DOCUMENTS

4,387,364  6/1983  Shirota .............................. 360/40 X
4,456,905  6/1984  Odaka ......................... 340/347 DD
4,547,890 10/1985  Gindi ..................................... 375/19

Primary Examiner—T. J. Sloyan
Attorney, Agent, or Firm—Perman & Green

[57] ABSTRACT

Code modification circuitry alters the end portion of each block in a sequence of code blocks, and also inserts additional bits at the junction between contiguous blocks. The codes to be processed are run-length limited (RLL) codes having a DC component which is to be removed for certain applications such as magnetic recording. The modification circuitry retains the RLL format. Charge (or the integral of the waveform) accumulated by the sequence of bits of one block is compensated by selecting the sense of charge accumulation in next block to be of opposite sense. This is accomplished by the code modification circuitry using a relatively small set of possible combinations of digital words at the junctions of the blocks.

15 Claims, 5 Drawing Figures

FIG. 5.
DECODER (RESTORE), 32

RUN-LENGTH LIMITED CODE WITHOUT DC LEVEL

DESCRIPTION

Technical Field

This invention relates to run-length limited codes useful in driving magnetic media and, more particularly, to the modification of such codes for the removal of any DC level, thereby to permit communication of such codes via circuitry which is incapable of handling the DC component.

Prior Art

Data or information in binary form is composed of data bits wherein the information in each bit is in the form of one or the other of two logic states, a logic 1 and a logic 0. The bits may be transmitted via communication channels, or may be recorded in storage media, particularly, magnetic media. When stored in magnetic media, a logic 1 and a logic 0 can be represented by alternate states of magnetic polarization or, alternatively, one of the logic states can be represented by a transition in magnetic state while the other logic state is represented by a lack of a transition as referenced to a suitable time frame.

Various forms of signal format are available for the transmission of digitized data as a series of data bits. For example, a logic 1 may be represented by a relatively high positive voltage while a logic 0 is represented by a relatively low positive voltage. Such a signal waveform clearly has a DC (Direct Current) component. Alternatively, a logic 1 can be represented as a pulse of positive voltage and a logic 0 as a pulse of negative voltage. The individual pulses may be identified by leaving spaces therebetween of value equal to zero volts or, alternatively, the individual portions of the waveform which are identified with respective ones of the data bits are designated by timing signals of a clock. With the foregoing waveforms wherein positive and negative excursions in voltage are present, the presence of a DC level depends on the duration of a succession of logic 1 signals as compared to the duration of a succession of logic 0 signals. Thus, in a series of data bits of a predetermined length, the magnitude of a DC level, if present, depends on the relative contributions of the positive and negative regions of the waveform.

In digital communication systems wherein a clock signal is employed for identifying a portion of a waveform which represents an individual data bit, such portions being transitions between positive and negative voltages, a positive voltage, or a negative voltage, receivers of a communicated message require the use of a clock which is synchronized to the data waveform.

Such synchronization can be obtained by constructing the digital waveform in a fashion wherein restrictions are placed on the length of a run of positive and negative portions of the waveform. The transitions between positive and negative voltages are utilized in the synchronization of a clock and, accordingly, the foregoing restriction on the waveform insures that such transitions occur sufficiently close in time to provide a desired accuracy in the synchronization of the clock with the waveform.

A digital waveform encoded with data bits arranged in accordance with a run-length limitation is identified often by use of a pair of numbers wherein the first number represents a minimum number of zeros which appear between a logic 1, the second number of the pair representing the maximum number of zeros which are to appear between a logic 1. Such a run length restriction may permit a DC level over a sufficient length of a sequence of data bits, such that the signal waveform would be distorted upon passage through capacitive or inductive coupling in a communication circuit or in a recording circuit. For example, a DC level slowly builds up a charge on a coupling capacitor which eventually leads to distortion of the signal waveform unless subsequent portion of the waveform introduce a discharging of the capacitor so that the average charge on the capacitor is zero. Similarly, with inductive coupling, a DC component in the voltage becomes integrated to produce an increasing flux leading to eventual distortion of the signal unless a succeeding sequence of bits introduces a negative contribution to the flux. Thus, a code constructed in a run-length limitation might have an excessive DC component which, heretofore, could not be removed with available designs of digital waveforms for encoding digital data.

The elimination of a DC or other frequency component from a coded waveform is disclosed in the following U.S. Pat. Nos. namely, Patel 3,810,111 issued May 7, 1974, Ouchi 3,995,264 issued Nov. 30, 1976, and Franaszek et al 4,028,535 issued June 7, 1977.

Of particular interest is a method and apparatus for generating a (1,7) code from an original code, and at $\frac{2}{3}$ the rate of the original code, as is disclosed more recently in a U.S. Pat. No. 4,413,251 by R. Adler et al issued Nov. 1, 1983. Data which has been coded in a format which does not have a run-length limitation is transformed by the foregoing method and apparatus into a code which does have a run-length limitation. The apparatus receives the incoming code, two bits at a time, and converts each sequence of two bits to a three bit sequence. Thereafter, the modified code may be transmitted over a communication channel, or may be stored in magnetic media. Subsequently, prior to utilization of the code by a receiver or display, the code is reconverted back to its original coded form, and then finally decoded to extract the data therefrom for presentation on the display or for some other purpose. While the foregoing Adler coding method and the set of codes resulting therefrom should be most useful, the utility thereof suffers from the presence of a DC level which may become excessively large and therefore introduce distortion in communication systems which cannot handle a DC component, as well as distortion in any recording of data in magnetic media.

SUMMARY OF THE INVENTION

It is an object of the present invention to provide a method and apparatus for converting a run-length limited code, particularly the foregoing Adler code, to a form which, on the average, has no DC level but still maintains the run length limitation of the original code. This object is met and other advantages are provided by a method and apparatus of the invention wherein the original code is divided into blocks, two additional bits are inserted between each of the blocks and, occasionally, individual ones of the bits may be changed in the leading and trailing sequences of four bits of each block so as to secure a reversal in the tendency of a capacitive charge (or magnetic flux) to be built up by the presence of a DC component in blocks of the original code.

In accordance with a system of the invention, data is first coded in a standard code, then transformed by the foregoing Adler code to a run-length limited code, which code is then modified by the invention for removal of long-term DC levels extending through plural blocks of the code. The modified code may then be stored or communicated to a receiver, after which the system of the invention provides for the restoration of the previous signal format to permit subsequent decoding and retrieval of the data. Alternatively, the invention can be applied to an existing run-length limited code, having characteristics similar to that of the foregoing Adler code, for removal of the DC level, followed by a subsequent restoration of the DC level.

A feature of the invention is found in the discovery that, due to run-length limitations, the leading and trailing ends of a block of the Adler code are limited in the number of distinct combinations of logic states of the individual bits. Thus, with each combination of a four-bit trailing end and four-bit leading end of consecutive thirty-bit blocks of the Adler code a tabulation of the logic states of the additional two bits can be made for directing subsequent charge associated with the DC component of a subsequent block so as to counteract the buildup of charge from a previous block.

Greater flexibility could be obtained by inserting more than the foregoing two additional bits between the code blocks, in the sense that the foregoing leading and trailing ends of a block would not have to be modified, or might require less modification for redirecting the direction of charge. However, such additional bits would slow down the data rate and require further storage capacity in the case of stored data. The choice of the two bits for insertion between successive code blocks is believed to be optimal in the sense that there is relatively little change in the data rate, and that no more than minimal changes are required in the format of logic states of the leading and the trailing ends of a code block. In the practice of the invention, the amount of charge introduced by a previous block, and the charge contribution of the present block is noted to determine whether a reversal in direction of charge build-up is required, so as to neutralize the effect of any DC component.

BRIEF DESCRIPTION OF THE DRAWINGS

The foregoing aspects and other features of the invention are explained in the following description taken in connection with the accompanying drawings wherein.

DETAILED DESCRIPTION OF THE PREFERRED EMBODIMENT OF THE INVENTION

Figure 1:
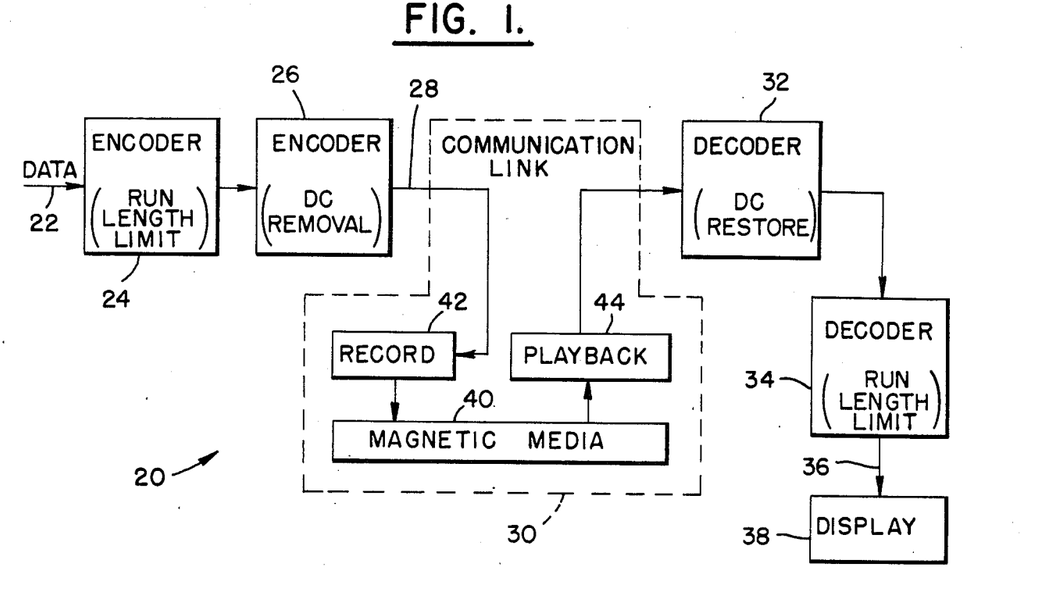
FIG. 1 is a simplified block diagram of a system incorporating the invention.

With reference to FIG. 1, there is shown a simplified embodiment of a communications system 20 incorporating the invention. Input data on line 22 is applied to an encoder 24 which encodes the data in the format of a limited run-length code. By way of example, the encoder 24 may be that disclosed in the aforementioned Adler patent. An output signal of the encoder 24 is applied to an encoder 26 which operates in accordance with the invention for modifying the code of the encoder 24 so as to remove the average DC level. The modified code appears on line 28 and is coupled via a communications link 30 to a decoder 32 which operates in accordance with the invention to restore the DC level and return the format of the coded data to that appearing at the output terminal of the encoder 24. The output signal of the decoder 32 is applied to a further decoder 34 which provides the inverse operation of the encoder 24 so as to present the data on line 36 in the same form as the data appears on line 22. The data on line 36 is applied to a utilization device such as a display 38. It is noted that the data on lines 22 and 36 may be in an encoded form such as the ascii code of alpha-numeric characters, or may be a digitized version of sample analog data as would be provided by an analog-to-digital converter (not shown).

The communication link 30 may employ a radio transmitter and receiver, or a telephone link (not shown) or as presented in the example of FIG. 1, comprises a magnetic medium 40 with a recording head 42 and a playback head 44 connected thereto. Signals on line 28 are applied to the medium 40 via the recording head 42 to be stored in the medium 40. The stored data is read out of the medium 40 by means of the playback head 44, and applied by the playback head 44 to the input terminal of the decoder 32.

In the operation of the system 20, the role played by the invention is found in the use of the encoder 26 and the decoder 32. The encoder 26 modifies an incoming digitized signal, such as that exemplified by the aforementioned code of the Adler patent, so as to remove the DC level and thereby prepare the digitized signal for further communication and by a capacitive coupling (not shown) or by the magnetic media 40. Upon retrieval of the digitized signal from the magnetic medium 40, the decoder 32 restores the digitized signal to its previous form, such as the code of the Adler patent, so that the digitized signal can then be utilized for its intended purpose, such as for the presentation of information on the display 38. The removal of the DC level is based on an examination of a present block of the code and one or more preceding blocks of the code to determine their respective contributions to a build-up of charge. The use of the term "charge" herein is the same usage set forth in the foregoing patent of Patel wherein the term is used to described both the charging which would be experienced by a capacitor through which the code is transmitted, as well as an analogous increase of voltage or current which would be experienced by an integrator through which the coded waveform passes. By observation of a drifting in the charge away from a value of zero charge, either a positive drift or a negative drift, a correction has been made by inserting a corresponding shift, a negative shift or a positive shift, so as to cancel the drifting of the charge away from the value of zero charge. This is accomplished by the insertion of additional bits between the code blocks and/or modification of the leading and trailing end portions of sequential blocks of the coded signal.

Due to the run-length limitation in the construction of the block code, there are relatively few combinations which can be formed among the digital words comprising the end portions of the code blocks plus the inserted bits. These relatively few combinations permit the restoration process by the decoder 32 to be accomplished by a relatively simple logic procedure wherein the modified end portions of the blocks are restored to their original format.

Figure 2:
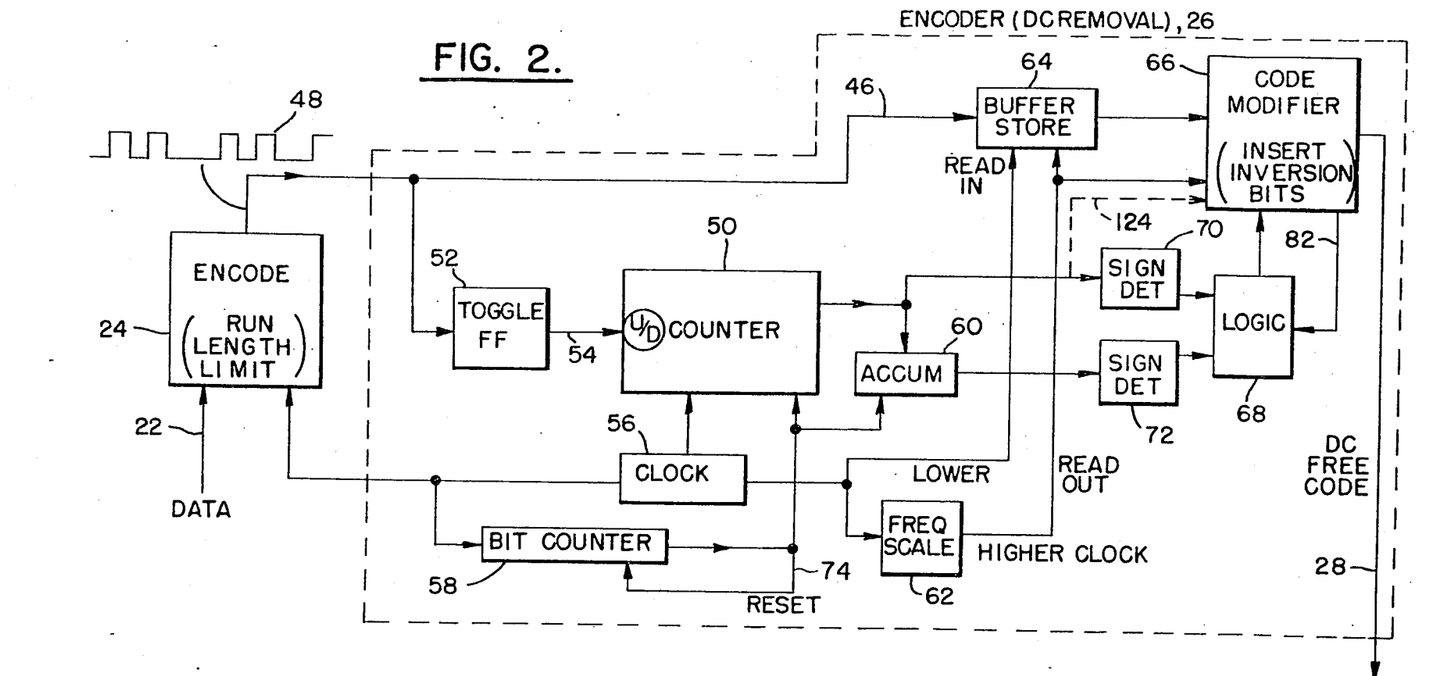
FIG. 2 shows a block diagram of an encoder of FIG. 1 which removes DC level in accordance with the invention.

FIG. 2 shows a block diagram of the encoder 26 coupled to the output terminal of the encoder 24 via a line 46 and providing the DC-free code on line 28. A stylized portrayal of a code signal propagating along line 46 is shown at 48. The encoder 26 comprises an up-down counter 50, a toggle flip-flop 52 responsive to positive and negative transistions in the waveform of the code signal 48 and providing an output signal on line 54, a clock 56, a counter 58, an accumulator 60, a frequency scaler 62, a buffer store 64, a code modifier 66, and a logic unit 68 with two sign detectors 70 and 72 coupled to input terminals thereof.

In operation, the counter 50 serves as an integrator which counts clock pulses from the clock 56. The output signal of the flip-flop 52 changes state with each transition in the waveform of the code signal 48, and is applied via line 54 to an up/down control terminal of the counter 50. The counter 50 counts up in response to a signal on line 54 indicating a relatively high voltage portion of the signal 48, as sensed by the flip-flop 52. The counter 50 counts down in response to a signal on line 54 indicating a relatively low voltage portion of the signal 48, as sensed by the flip-flop 52. In order to provide synchronism between the operation of the encoder 24 and the encoder 26, pulses of the clock 56 are employed also for driving the encoder 24. The counter 58 counts pulses of the clock 56 so as to provide a count representative of the length of a code word of the signal 48. The counter 58 is set to provide an output signal on line 74 upon the conclusion of each block of the signal 48. In the case of the aforementioned code of the Adler patent, each block of the code has 30 bits, and, accordingly, the counter 58 would be set to a value of 30 for use with the foregoing Adler code. Upon reaching the count of 30, the counter 58 generates the pulse on line 74 which resets the counter 58, and also resets the counter 50 and strobes the accumulator 60.

It should be understood that the waveform of the signal 48 provides for the same scheme of coding as has been described hereinabove, namely, that a transition in voltage level represents a logic-1 while a steady value of voltage level represents a logic-0. Clock signals from the clock 56 provide benchmarks in which the voltage levels of the signal 48 are observed. Both positive and negative transitions occurring at the time benchmarks are treated as logic-1 signals while both steady high and low voltage levels observed at the time benchmarks are treated as logic-0 signals. As is well known, the charge of a signsal having the waveform of the signal 48 can be observed by coupling the signal via a capacitor (not shown), in which case charge builds up in a positive direction for a sequence of logic states of zero following a positive transition in the signal 48. Similarly, the charge builds up in a negative direction during a sequence of logic states of zero following a negative transition in the signal 48. It is particularly significant to note that, in accordance with a feature of the invention, the interposition of an additional logic-1 digit is accomplished by the formation of an additional transition in the waveform of the signal 48, this resulting in a change in the sense of which charge can build up.

By virtue of the resetting of the counter 50 at the conclusion of each block of the code, the total count of the counter 50 is representative of the charge accumulated by the block of the code. The charge may have a zero value, or a non-zero value which is either positive or negative. The count of the counter 50 is stored in the accumulator 60 upon the strobing thereof by the signal on line 74. Thereby, the accumulator 60 stores a history of past buildup of charge, while the output of the counter 50 is the value of the charge of the most recent block. The output count of the counter 50 is applied to the detector 70 which detects whether the count, or charge represented by the count, is positive or negative. The positive or negative sign of the charge is applied by the detector 70 as an input to the logic unit 68. Similarly, the output count, or charge, of the accumulator 60 is applied to the detector 72 which detects whether the accumulated charge is positive or negative. The sign of the accumulated charge is applied by the detector 72 as an input to the logic unit 68.

It is readily appreciated that the information presented by the detector 70 depends on when the output of the counter 50 is read by the detector 70. For example, at the beginning of a code block, after the resetting of the counter 50, the output sign bit of the counter 50 is at the same logic state as the up/down signal on line 54, which sign bit is detected by the detector 70. The sign bit at the beginning of a counting interval of the counter 50 represents the sense of charge accumulation which is to occur at the beginning of a code block. On the other hand, by way of further example, a reading of the output of the counter 50 at the end of a code block provides information as to both the sign and the magnitude of charge accumulated over the duration of a single code block. Both of the foregoing data are utilized by the invention; the former relating to the beginning of the code block is employed by the detector 70, while the latter data of the accumulated charge is employed by the modifier 66 in a further embodiment of the invention.

The buffer store 64 receives the signal on line 46 from the encoder 24. The coded signal on line 46 is clocked into the store 64 by clock pulses of the clock 56. The bits of the coded signal are subsequently read out of the store 64 at a higher clocking rate by clock pulses applied by the frequency scaler 62. The scaler 62 is driven by pulses of the clock 56, and include well known counting circuitry and, possibly, an additional clock (not shown) synchronized by pulses of the counters of the scaler 62. If desired, circuitry of the scaler 62 and the clock 56 may be combined into a single clock circuit (not shown) providing output clock pulses at both a lower and a higher clock frequency.

Figure 3:
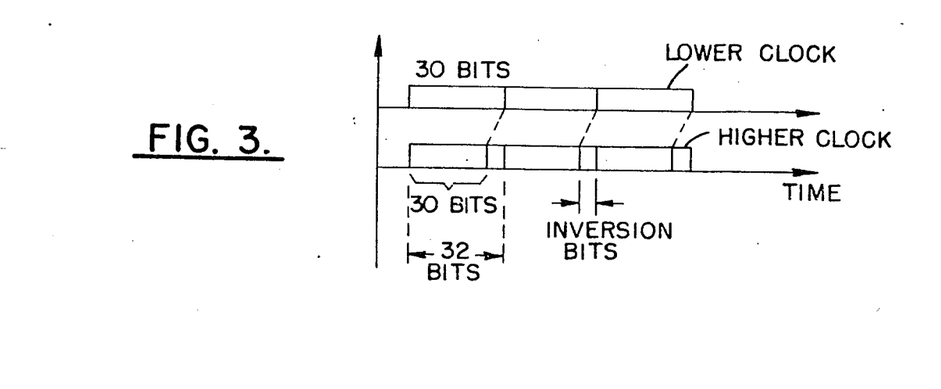
FIG. 3 is a timing diagram useful in explaining relative code length of block codes processed by the circuit of FIG. 2.

The buffer store 64 provides two functions, namely, the storage of the incoming coded signal on line 46 until such time as charge data of the present code word is made available by the counter 50 and an increasing of the clocking rate so as to accommodate the additional bits which are to be inserted by the code modifier 66. This may be explained with reference to the timing diagrams of FIG. 3 wherein the upper diagram shows blocks of 30-bit code words propagating on the line 46, while the lower graph shows the corresponding 32-bit blocks appearing at the output of the code modifier 66 on line 28. As shown in FIG. 3, the time duration of the 30-bit block is the same as the time duration of the 32-bit block. In order to accommodate the equality of the timed durations, the clocking rate must be increased by the ratio of the bits (32/30).

The logic unit 68 directs the modifier 66 either to alter the sense (positive or negative) of the charge buildup of a code block, or to leave the sense in its present state. By way of example, assuming that an incoming code block will have a positive quantity of charge and, if the signs detected by the detectors 70 and 72 are of opposite sense, this resulting in a correction of charge buildup and reduction in the DC component, the logic unit 68 commands the modifier 66 to retain the state of the charge of the present code block. In the event that the detectors 70 and 72 detect equal signs in the charges of the counter 50 and the accumulator 60, this indicating a continuing buildup of charge and of the DC component for the foregoing case of an anticipated positive charge in the incoming code block, the logic unit 68 commands the modifier 66 to invert the sense of the charge of the present code block. Thereby, and as will be explained subsequently in further detail, the charge of the code block exiting the modifier 66 is always of the proper sense to correct the accumulation of charge.

Figure 4:
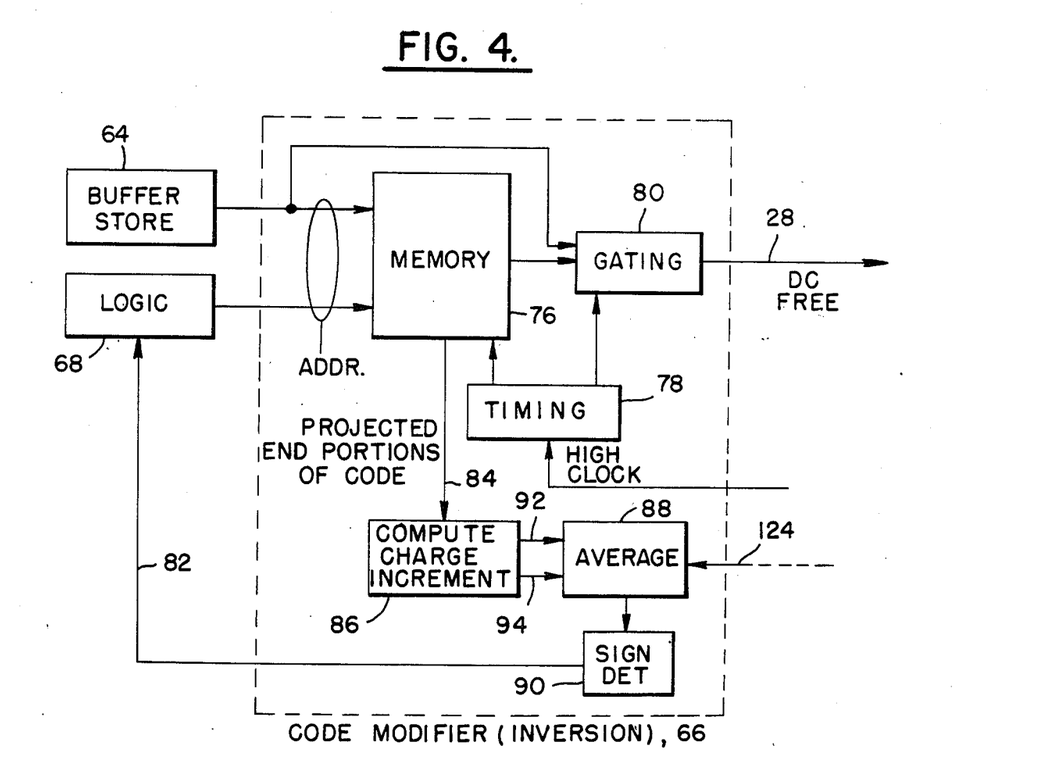
FIG. 4 is a block diagram of encoding circuitry within the encoder of FIG. 2 for inserting the additional bits for controlling the direction of charge buildup.

The code modifier 66, as shown in FIG. 4, comprises a memory 76 which may be a read-only memory, a timing unit 78 and a gating unit 80. The code stored in the buffer store 64 is applied to the gating unit 80, and is also applied along with an output signal of the logic unit 68 as an address to the memory 76. The timing unit 78 is driven by the high clock pulses of the scaler 62 (FIG. 2), and provides timing signals for operation of the memory 76 and the gating unit 80. In the case of the foregoing exemplary Adler code, leading and trailing end portions, each of which comprise six bits, are employed in the addressing of the memory 76. The timing unit 78 operates the memory 76 to be responsive to the occurrence of the bits in the leading and trailing end portions. The timing unit 78 operates the gating unit to receive all of the bits of a code block from the store 64 except for the bits of the leading and trailing end portions of the code word, and to substitute in their stead the modified set of bits for the end portions plus the additional two bits which are inserted between the code blocks.

In operation, the modification of code blocks in a series of the code blocks involves the trailing end portion of the previously completed block, the leading end portion of the code block presently entering the buffer store 64, and the insertion of the two additional bits between the trailing and the leading end portions. The appropriate set of bits to be substituted for the two end portions, and the set of two additional bits are provided by the memory 76. Since the memory 76 is a read-only memory information about the appropriate set of bits is stored prior to utilization of the encoder 26. This information will be disclosed hereinafter in the table entitled "SUBSTITUTIONS", the information including the sets of digits for both cases wherein either inversion or noninversion of charge accumulation is required.

The address applied to the memory 76 by the store 64 is composed of the digits of the trailing end portion of the previously completed code block and the leading end portion of the present incoming code block. For example, in the preferred embodiment of the invention, each of the end portions may include up to six digits (note left column of substitutions table) for a total of twelve digits in the address provided by the buffer store 64 to the memory 76. While a twelve digit address might seem to require an inordinately large memory capacity, in practice much less storage capacity is required because significantly less addresses are actually produced in view of run-length limitations in the code blocks. For each address, there are two storage locations containing separate bit sequences, one sequence for the case of implementing an inversion in the sense of charge accumulation, and the other sequence for the case of retaining (non-inversion) the present sense of charge accumulation.

As noted above, the buffer store 64 stores blocks of code before the timing unit 78 activates the gating unit 80 to receive digits of a code block from the store 64 and the memory 76. In particular, it is noted that the trailing end portion of the previously completed code block and the present incoming code block are stored in the store 64 for a sufficient length of time to permit selection of the appropriate sequence of digits from the memory 76. The appropriate sequence, for inversion or noninversion of the sense of charge accumulation is selected in accordance with an output signal of the logic unit 68, which signal forms a part of the address to the memory 76. Thereby, the memory 76 can make available the appropriate sequence of digits to be substituted for the sequence of digits which compose the foregoing trailing and leading end portions under control of timing signals from the timing unit 78. The gating unit 80 acts as a switch for connection of end portions of code blocks and the extra two digits therebetween from the memory 76 to line 28, with the balance of the digits of code blocks being connected from the store 64 to the line 28.

By way of alternative embodiments, it is noted that the modifier 66 may be constructed in the form of a programmable logic array. With the programmable logic array (not shown) the bits of an imcoming code block would be applied to a set of input lines of the array, and the bits of the output modified code block would appear on a set of output lines of the array. Interconnections between the input and output set are provided so as to perform the same function as that performed by the memory 76 and the gating unit 80 in response to the addressing provided by the signals of the store 64 and the logic unit 68.

The foregoing operation may be better understood with reference to the following mathematical analysis which is directed to a run-length limited (1,7) code, of the form disclosed in the aforementioned Adler patent wherein each code block is composed of 30 bits, and wherein two bits are inserted by the circuitry of the invention between successive ones of the code blocks. In this situation, the total accumulated charge does not exceed thirty in absolute value. The rate of data propagation of the code, prior to the insertion of the additional two bits, is $\frac{2}{3}$ because the thirty bits in a code block contain only twenty bits of data. This limitation on data rate is due to run-length constraints on the coding; all of the thirty bits do carry data. Upon the insertion of the additional 2 bits, the data rate is reduced to $20/32 = 0.625$. In the event that noise or other source causes an error in a bit of the code block, the error propagation of the decoder is limited; one error in the encoded bits can result in no more than ten errors in the decoded bits.

As will become apparent in the ensuing mathematical presentation, the modification of the end portions of the code blocks results in a change in the total charge which would be accumulated. Such change would not be accounted for by the count of the counter 50, which count is based on the imcoming code block, prior to modification. Accordingly, it is desirable to provide still further basis for decision of the logic unit 68, which further basis is applied via line 82 from the modifier 66. The further basis for the decision of the logic unit 68 is based in the charge which would be accumulated in the trailing edge of one code block plus the leading edge of the following code block for the cases of inversion and noninversion of the sense of charge accumulation, as will be described in further detail in the ensuing mathematical description. An average value of accumulated charge for inversion and accumulated charge for noninversion plus the charge of the additional digits between the end portions are employed. Also, as is disclosed in the ensuing mathematical description, a complete determination of the basis for decision includes the charge accumulated between end portions, this being the central portion, of the most recently completed code block. To facilitate the description of the invention, this embodiment is described without reference to the charge accumulated in the central portion, this resulting in favorable operation in the event that the accumulated charge in the central portion averages to approximately zero. The contribution of the accumulated charge of the central portion of the most recently completed code block is employed in an alternative embodiment of the encoder 26 as will be described hereinafter.

The memory 76 outputs projected end portins of the code blocks for both of the cases, namely inversion or noninversion of the direction of charge accumulation. The projected end portions are coupled via line 84 to a computer 86 of the charge increment which provides two values of charge increment, one corresponding to the case of inversion, and the other corresponding to the case of noninversion of the direction of charge accumulation. The modifier 66 further comprises an averaging unit 88 and a sign detector 90. The two possible values of charge increment are coupled via lines 92 and 94 to the averaging unit 88 which provides the average value of the two charge increments. The detector 90 detects the sign of the average value, and applies the sign the average value along line 82 to the logic unit 68 for a determination as to whether inversion or noninversion of the direction of charge accumulation is to be ordered by the address lines to the memory 76. The significance of this later step in the process will become apparent from the following mathematical description.

The encoder inserts two bits ($\gamma_1$, $\gamma_2$) between successive blocks of 30 bits ($\eta_1, \ldots, \eta_{30}$) of output from the (1,7) encoder. It may also change the values of the four bits on each end of this 30-bit block. We denote the new values of the 30-bit block by $\alpha_1, \ldots, \alpha_{30}$.

Let $\eta_{-5} \ldots \eta_0$ and $\alpha_{-5} \ldots \alpha_0$ refer to the last digits of the previous block. For each value of $\eta_{-5} \ldots \eta_0 \cdot \eta_1 \ldots \eta_6$ there are two choices for $\alpha_{-5} \ldots \alpha_0 \cdot \gamma_1 \gamma_2 \cdot \alpha_1 \ldots \alpha_6$. The choice labelled "0" has the same parity as the input: $\alpha_{-5} + \ldots + \alpha_0 + \gamma_1 + \gamma_2 + \alpha_1 + \ldots + \alpha_6 = \eta_{-5} + \ldots + \eta_0 + \eta_1 + \ldots + \eta_6$ modulo 2, while the choice labelled "1" has the opposite parity. The change in parity coincides with the change in direction of charge accumulation. Choice "1" has the effect of changing the direction of charge accumulation, while choice "0" leaves the direction unchanged, i.e. as it would have been in the absence of the present encoding.

The ensuing description employs the following definitions:

The charge of a sequence $x_2 x_2 \ldots x_n$ is the cumulative charge after writing the sequence $x_1 \ldots x_n$, given that before writing $x_1$ the cumulative charge was 0 and increasing. Thus for arbitrary strings x (where $\phi$ is the empty string):

charge $(\phi) = 0$
charge $(0 \cdot x) = 1 +$ charge $(x)$
charge $(1 \cdot x) = -1 -$ charge $(x)$ For a given value of $\eta_{-5} \ldots \eta_0 \cdot \eta_1 \ldots \eta_6$, choice 0 yields the string $\alpha^0_{-5} \ldots \alpha^0_0 \gamma^0_1 \gamma^0_2 \cdot \alpha^0_1 \ldots \alpha^0_6$, while choice 1 yields the string $\alpha^1_{-5} \ldots \alpha^1_0 \cdot \gamma^1_1 \gamma^1_2 \cdot \alpha^1_1 \ldots \alpha^1_6$ Let $e^0$ denote the charge of the sequence $\alpha^0_{-3} \ldots \alpha^0_0 \cdot \gamma^0_1 \gamma^0_2 \cdot \alpha^0_1 \ldots \alpha^0_4$, where the superscripted 0 is an index (not an exponent).

Let $e^1$ denote the charge of the sequence $\alpha^1_{-3} \ldots \alpha^1_0 \cdot \gamma^1_1 \gamma^1_2 \cdot \alpha^1_1 \ldots \alpha^1_4$, where the superscripted 1 is an index (not an exponent).

A parenthesized argument "(n)" indicates the location at which the function is computed, so that $e^0(n)$ is computed at the boundary between blocks n and n+1.

Let c(n) denote the cumulative charge at four bits before the end of the nth block. Let r(n) denote the direction of charge accumulation (either +1 or −1) at that same time.

The encoder (assuming the embodiment of a programmable logic array or a real-time computer) will tabulate the two quantities $E(n) = (e^0(n) + e^1(n))/2$ and $F(n) = (e^0(n) - e^1(n))/2$.

Let m(n) denote the charge of the sequence $\eta_5 \ldots \eta_{26}$, in block n.

Let s denote the parity of $\eta_{-3} \ldots \eta_0 \cdot \eta_1 \ldots \eta_4$, i.e. $s = +1$ if there are an even number of 1's in the sequence, and $s = -1$ if there are an odd number of 1's in the sequence. This is the same as the parity of $\alpha^0_{-3} \ldots \alpha^0_0 \cdot \gamma^0_1 \gamma^0_2 \cdot \alpha^0_1 \ldots \alpha^0_4$. Similarly, let t denote the parity of the sequence $\alpha_5 \ldots \alpha_{26}$.

For $n > 0$, set $d(n) = c(n) + r(n) E(i \, n)$. Thus d(n) will be the average of two possible values of the cumulative charge after four bits into block n+1, corresponding to the choice between blocks n and n+1.

Define $\Delta(n) = r(i \quad n-1) F(n-1) + r(n-1) s(i \, n-1) m(n) + r(i \, n-1) \, s(n-1) t(n) E(n)$.

It is noted that if a choice of "0" is made between blocks n-1 and n, then $d(n) = d(n-1) + \Delta(n)$, while with a choice of "1", $d(n) = d(n-1) - \Delta(n)$. Also, $r(n) = r(n-1) \, s(n-1) t(n)$ with a choice of "0", or $-r(n-1) s(n-1) t(n)$ with a choice of "1".

Consider the case when choice = "1". Then
$d(n) = d(n-1) - r(n-1)$
$F(n-1) - r(n-1) s(n-1) m(n) - r(n-1) s(n-1) \, t(n) E(n)$.
Recall
$d(n-1) = c(n-1) + r(n-1) E(n-1) = c(n-1) + r(n-1) (e^0(n-1) + e^1(n-1))/2$, where $c(n-1)$ is a cumulative charge. The next term is $-r(n-1) F(n-1) = -r(n-1) (e^0(n-1) - e^1(n-1))/2$. Adding, the $e^0(n-1)$ cancel, and the $r(n-1) e^1(n-1)$ gives the contribution to the actual cumulative charge, under choice 1, of the ten bits $\alpha^1_{-3} \ldots \alpha^1_0, \gamma^1_1 \gamma^1_2, \alpha^1_1 \ldots \alpha^1_4$. The third term gives the contribution of bits 5 through 26 in the nth block (with the correct sign). The final term s is just r(n)E(n). Thus the first three terms give the cumulative charge at four bits before the end of the nth block (i.e. c(n)), and the last term corrects this to d(n).

Let the choice be "0" or "1", between blocks n-1 and n, in order to minimize the absolute value of d(n). Thus if d(n−1) and Δ(n) have the same signs, choose "1" (in order to subtract Δ(n) from d(n−1) and thereby reduce the magnitude); if d(n−1) and Δ(n) have opposite signs, choose "0", and if one of them has value 0, make either choice.

It is further noted that Δ(n) is bounded; its absolute value cannot exceed 19.

Because of this, d(n) is also bounded; its absolute value cannot exceed 19. Such must be the case because otherwise, the first time that |d(n)| exceeds 19, since |Δ(n)| ≦ 19, it must be that either |d(n−1)| > |d(n)|, or else d(n−1) and [d(n)−d(n−1)] have the same sign. The first case is impossible because |d(n)| is the first value exceeding 19, and the second case is impossible by our choice of "0" or "1".

In turn, the actual cumulative charge at any time is "close" to the value of d(n) at the nearest block boundary, and so is in turn bounded by 30.

The following tabulation shows the interfacing bits between two contiguous code blocks (the trailing end of one block and the leading end of the succeeding block) in the left column, with substitutions therefor being shown in the middle and the right columns. Each substitution includes the two additional bits between the blocks, and may also provide for a change in some of the bits in the leading and the trailing ends. The middle column (parity change) provides a change in the direction of charge accumulation, and the right column (no parity change) retains the direction of charge accumulation.

| end of block. beginning of block | SUBSTITUTIONS no parity change | parity change |
|---|---|---|
| 0.1 | 0.00.1 | 0.10.1 |
| 1.0 | 1.00.0 | 1.01.0 |
| 0.0 but not 3 0's on either side | 0.00.0 | 0.10.0 |
| 0.0001 | 0.00.0001 | 0.01.0001 |
| 1000.0 | 1000.00.0 | 1000.10.0 |
| 100.0000 | 101.00.1000 | 100.01.0000 |
| 0000.001 | 0001.00.101 | 0000.10.001 |
| 010.00001 | 010.00.00001 | 010.01.00001 |
| 10000.010 | 10000.00.010 | 10000.10.010 |
| 101010.000001 | - - -001.00.100101 | - - -010.01.000001 |
| 100000.010$\overline{101}$ | 101001.00.100- - - | 100000.10.010- - - |
| 101010.000001 | 101000.01.000001 | 101010.01.000001 |
| 100000.010101 | 100000.10.000101 | 100000.10.010101 |

*NOTE: $\overline{101}$ indicates all combinations except 101.

In the following table there are shown possible end portions of the code blocks. In correspondence with each of the block ends, there are provided the charge increments associated with the cases of inversion and noninversion of the direction of charge accumulation. This is the information provided by the computer 86 (FIG. 4), which information is then utilized as explained hereinabove, by the logic unit 68 as to whether an inversion or noninversion is to be commanded via the address lines to the memory 76. The charge increments are as follows.

| BLOCK ENDS | $\frac{e^0+e^1}{2}$ | $\frac{e^0-e^1}{2}$ | BLOCK ENDS | $\frac{e^0+e^1}{2}$ | $\frac{e^0-e^1}{2}$ |
|---|---|---|---|---|---|
| 0000.1000 | 4 | −2 | 0001.0000 | 1 | −5 |
| 0000.1001 | 4 | 0 | 0001.0001 | 1 | −3 |
| 0000.1010 | 4 | 2 | 0001.0010 | 1 | −1 |
| 1000.1000 | −4 | 2 | 0001.0100 | 1 | 1 |
| 1000.1001 | −4 | 0 | 0001.0101 | 1 | −1 |
| 1000.1010 | −4 | −2 | 1001.0000 | −1 | 5 |
| 0100.1000 | −2 | 2 | 1001.0001 | −1 | 3 |
| 0100.1001 | −2 | 0 | 1001.0010 | −1 | 1 |
| 0100.1010 | −2 | −2 | 1001.0100 | −1 | −1 |
| 0010.1000 | 0 | 2 | 1001.0101 | −1 | 1 |
| 0010.1001 | 0 | 0 | 0101.0000 | 1 | −5 |
| 0010.1010 | 0 | −2 | 0101.0001 | 1 | −3 |
| 1010.1000 | 0 | −2 | 0101.0010 | 1 | −1 |
| 1010.1001 | 0 | 0 | 0101.0100 | 1 | 1 |
| 1010.1010 | 0 | 2 | 0101.0101 | 1 | −1 |
| 0100.0010 | −2 | −2 | 0100.0001 | −3 | −3 |
| 0100.0100 | −2 | 0 | 0010.0001 | −1 | −3 |
| 0100.0101 | −2 | −2 | 1010.0001 | 1 | 3 |
| 0010.0010 | 0 | −2 | | | |
| 0010.0100 | 0 | 0 | 1000.0010 | −4 | −2 |
| 0010.0101 | 0 | −2 | 1000.0100 | −4 | 0 |
| 1010.0010 | 0 | 2 | 1000.0101 | −4 | −2 |
| 1010.0100 | 0 | 0 | | | |
| 1010.0101 | 0 | 2 | | | |
| 0100.0000 | 4 | 2 | 0010.00001 | −1 | −5 |
| 0000.0010 | 1 | −1 | 1010.00001 | 1 | 5 |
| 101010.000001 | | | 1000.0100 | 4 | 0 |
| 0010.000001 | 3 | −1 | 10000.0101 | 4 | 2 |
| 1010.000001 | −3 | 1 | | | |
| | | | 101010.000001 | −2 | 2 |
| 100000.010$\overline{101}$ | | | | | |
| 100000.0100 | 0 | −4 | 100000.010101 | 1 | −1 |
| 100000.0101 | 0 | −2 | | | |

The operation of the circuitry of FIG. 4 can be further explained in view of the foregoing tabulated data. The averaging unit 88 provides the averages of the accumulated charge for the cases of the inversion and noninversion, as indicated at the tops of the columns, and sums together the two values of charge indicated in the tabulated data, this sum being outputted to the detector 90. Note that only four bits of each end portion are employed in the process as indicated in the tabulated data. For example, in the case of the first term of the tabulated data, the two computed values of averaged charge are 4 and −2. The sum of these two values is +2. In a further embodiment of the invention, this value is added to the charge actually accumulated during the most recent code block to provide an output signal which is applied to the sign detector 90. The signal of this sum is then outputted via line 82 to the logic unit 68, a logic-1 signal on line 82 representing a positive sign and a logic-0 signal on line 82 representing a negative sign for the signal inputted to the detector 90. The same convention also applies to the the other two inputs to the logic unit 68 from the detectors 70 and 72, each of these inputs also being one-bit signals.

With respect to the operation of the logic unit 68, two examples already have been given for the set of three input signals to the logic unit 68. In one example, all three inputs were logic-1 resulting in a command to invert, and in the second case, one of the input signals has a logic state of zero resulting in a command for noninversion. In the event that two of the input signals to the logic unit 68 have a state of logic-0, and one of the input signals has a state of logic-1, the logic unit 68 outputs a command to invert. If all of the input signals to the logic unit 68 are negative, as represented by states of logic-0, the logic unit 68 outputs a noninversion command. The foregoing set of logic commands are readily represented by modulo-2 addition of the three one-bit input signals.

The decoder 32 recovers the original RLL (run-length limited code) constrained bits from the RLL and charge constrained bits output by the previous encoder. It takes a block of thirty-two bits, composed of thirty data bits and two charge bits $$a_1 a_2 \ldots a_{29} a_{30} \gamma_1 \gamma_2$$

and converts it into thirty RLL constrained data bits $$\eta_1 \eta_2 \ldots \eta_{29} \eta_{30}.$$

No changes are made in the middle twenty-two bits $$\eta_k = a_k, k = 5, 6, \ldots 26.$$

Some changes may be made in the beginning and ending four bits. The changes in the beginning (ending) four bits of a block may depend on the last (first) fix bits of the preceding (succeeding) block as well as the first (last) six bits of the block itself. The picture is:

$$a_{-5} a_{-4} a_{-3} a_{-2} a_{-1} a_0 \gamma_1 \gamma_2 a_1 a_2 a_3 a_4 a_5 a_6$$

determines $$\eta_{-3} \eta_{-2} \eta_{-1} \eta_0 \eta_1 \eta_2 \eta_3 \eta_4$$

The rules for changes are given by the table below, no listing means no changes are made.

| $a_{-5} a_{-4} a_{-3} a_{-2} a_{-1} a_0 .\gamma_1 \gamma_2. a_1 a_2 a_3 a_4 a_5 a_6$ | $\eta_{-3} \eta_{-2} \eta_{-1} \eta_0 . \eta_1 \eta_2 \eta_3 \eta_4$ |
|---|---|
|           1 .- - .1 | 0 . |
|           1 .- - .1 |    .0 |
| 1 0 1 0 0 1 .- - .1 0 0 | 0 — — —. |
|     0 0 1 .- - .1 0 0 1 0 1 |    .- - - 0 |
|     0 0 1 .- - .1 0 0 1 0 1 | 1 —. |
| 1 0 1 0 0 0 .- - .0 0 0 | 1 —. |
| 1 0 1 0 0 1 .- - .1 0 0 |    .—1 |
|     0 0 0 .- - .0 0 0 1 0 1 |    .—1 |

The logic functions that execute these changes (or no changes) follow.

$$\eta_0 = a_0 \bar{a}_1 \quad \eta_1 = \bar{a}_0 a_1 \quad \eta_{-3} = a_{-3}\overline{(a_{-5} a_0 a_1 a_3)} \quad \eta_4 = a_4 \overline{(a_{-2} a_0 a_1 a_6)}$$

$$\eta_{-1} = \bar{a}_{-2} a_0 a_1 a_4 a_6 \vee a_{-5} a_{-3} \bar{a}_{-1} \overline{a_0 a_1 a_2 a_3} \vee a_{-1}$$

$$\eta_2 = a_{-5} a_{-3} a_0 a_1 a_3 \vee \bar{a}_{-2} \bar{a}_{-1} \overline{a_0 a_1 a_2 a_4 a_6} \vee a_2$$

Figure 5:
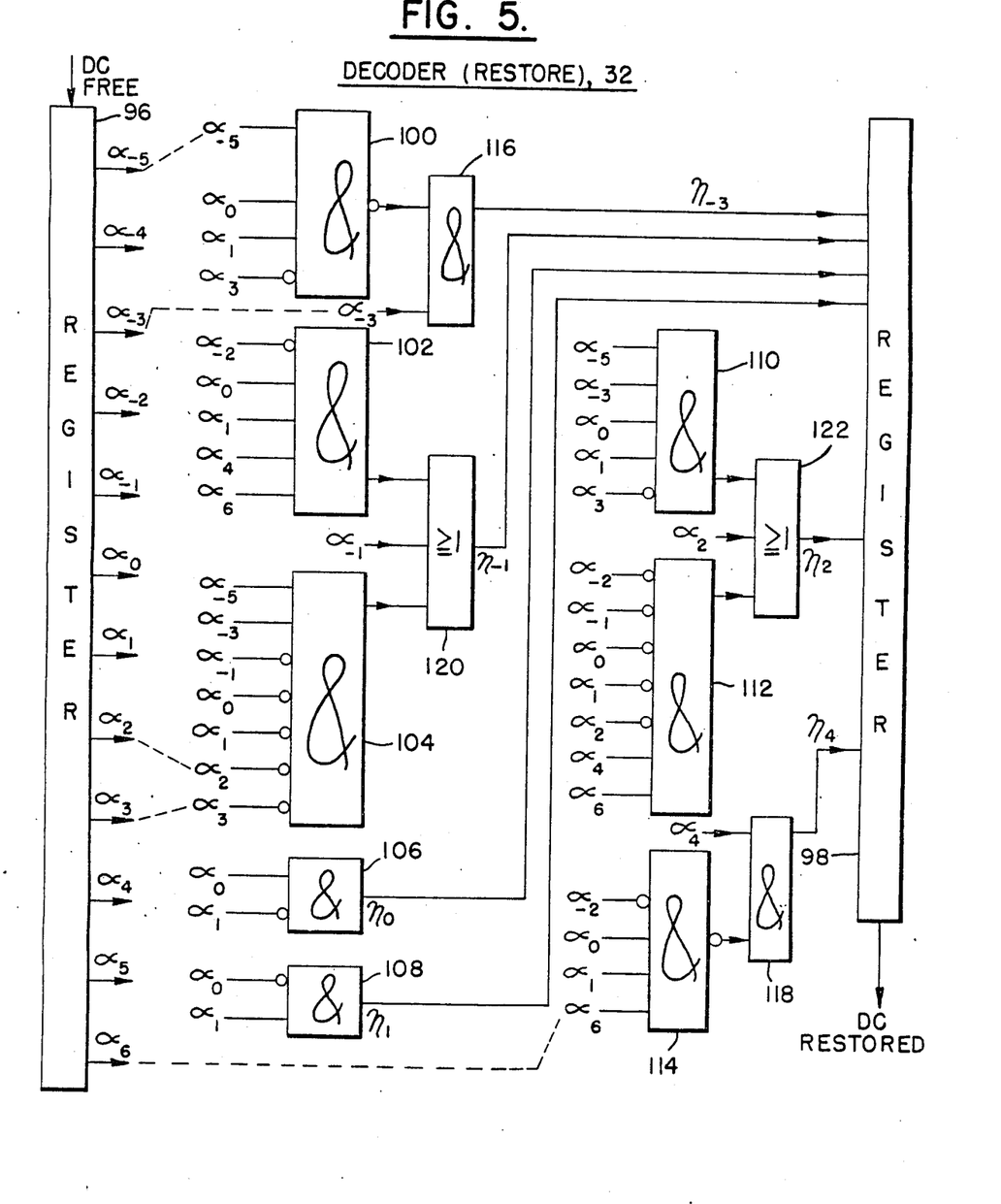
FIG. 5 shows a decoder of FIG. 1 for restoring DC level.

The process described by the foregoing mathematical equations is implemented by the decoder 32 as shown in FIG. 5. The code, free of the DC level, is applied from the communication link 30 (FIG. 1) to an input register 96 of the decoder 32. The decoder further comprises an output register 98, a set of ten AND gates 100, 102, 104, ... 118, and two OR gates 120 and 122 which are connected between the registers 96 and 98. Input signals to the AND gates are provided by the input register 96. Three input signals are provided to each of the OR gates, two of the three input signals being coupled from AND gates and the third input signal being provided by the register 96. The connection of the signals between the register 96 and the gate follows that shown in the foregoing equations. By way of example, the last equation is implemented by the AND gates 110 and 112, and the OR gate 122.

Error propagation is limited. One error in the RLL and charge constrained bits can result in no more than eight errors in the RLL constrained bits. The decoder set for the foregoing Adler code (1,7), has an error propagation of six bits. When the bits are decoded to the user by first passing through the decoder 32 and 34, the error propagation is again limited. One error in the RLL and charge constrained bits can result in no more than ten errors in the unconstrained user bits.

By way of alternative embodiments it is noted that the decision process in determining whether or not an inversion is to be made can be accomplished in a further fashion as is shown with reference to FIGS. 2 and 4. In lieu of the coupling of the counter 50 to the logic unit 68 by the detector 70, the counter 50 may be coupled via a line 124 to the averaging unit 88 of the modifier 66. The averaging unit 88 would then sum the count of the counter 50 with each of the signals on the lines 92 and 94 to provide the complete charge accumulation which would occur over the duration of a complete block of the code, including both possible modifications of the end portions of the code block.

In comparing the alternative embodiment with the previously described embodiment, the operation of the logic unit 68 has been simplified in that only two input signals are applied thereto. However, the operation of the encoder 26 is in both cases in accordance with the mathematical description for the following reason. In the first embodiment of the invention, the signals provided by the detectors 70, 72, and 90 represent, respectively, the sense of charge accumulation at the beginning of the code block, the sign of charge accumulation at the beginning of the code block, and the sign of the charge accumulated by the code block. With the alternative embodiment of the invention, the count outputted by the counter 50 at the end of the code block includes both the magnitude of the charge and the sign of the charge accumulated during the code block. This is a composite of both the sense of accumulation and the actual amount of accumulation so that only two inputs are required to the logic unit 68. This corresponds to the choice of two selections, set forth near the end of the mathematical description before the tabulated data, wherein the logic unit 68 is to output a logic-1 commanding inversion when the two input signals are equal, and a logic-0 commanding noninversion when the two input signals differ.

The foregoing circuitry and coding process has provided a convenient transformation of a run-length limited code which removes the average value of the DC level so as to permit the coded signal to be transmitted via a communication link which does not respond to a DC component, and also to permit the coded signal to be stored in magnetic media. While the foregoing description has been directed to such code having a limitation (1,7), it is to be understood that the teachings of the invention are applicable to codes having other restrictions on the number of logic 0's which may be placed between logic 1's.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

Having thus described our invention, what we claim as new, and desire to secure by Letters Patent is:

1. A method for modifying a run-length limited code to delete a DC component therefrom while retaining the run-length limitation comprising the steps of:

receiving a succession of blocks of a code comprising a succession of digital bits and having a predetermined format and a predetermined run-length limitation;

analyzing each block to determine the presence of a charge accumulation thereon;

modifying a presently occurring code block to provide a charge contribution in a sense opposite to the sense of charge accumulated prior to said presently occurring block, thereby to counteract a DC component; and wherein said step of modifying preserves said run-length limitation in each of said code blocks, said modifying including the steps of:

providing predetermined sets of substitute end portions for both leading and trailing end portions of a block of said code;

inserting additional code bits between a trailing end portion and a leading end portion of successive ones of said blocks, each said end portions having a predetermined number of bits; and selecting, by means of the combined set of bits in a trailing end portion and the following leading end portion, an appropriate set of substitute end portions and the additional bits.

2. A method according to claim 1 further comprising a step of restoring said predetermined format; and wherein said step of restoring preserves said run-length limitation.

3. A method according to claim 1 wherein said analyzing includes a step of measuring charge accumulation in the presently occurring block of said code and a preceding block of said code, said selecting being based further on measurements of accumulated charge.

4. A method according to claim 1 wherein said modifying further includes a step of altering the polarity of at least one bit in an end region of a block of said code.

5. A method according to claim 4 wherein said analyzing includes a step of measuring charge accumulation in the presently occurring block of said code and a preceding block of said code, said selecting being based further on measurements of accumulated charge, and wherein said step of modifying also modifies the trailing end portion of said preceding block.

6. A method according to claim 5 wherein said steps of inserting and altering establish a direction of charge accumulation of said presently occurring code; and wherein said step of providing is accomplished by storing the predetermined sets of substitute end portions in a memory, and said selecting includes an addressing of the memory with said combined set of bits of the trailing and the end portions.

7. A method according to claim 6 wherein said step of analyzing includes a step of deciding whether the direction of charge accumulation of said presently occurring code word is to be inverted.

8. A method according to claim 7 wherein said step of deciding includes a step of comparing charge accumulation of a previous code block with a charge accumulation of said presently occurring code block.

9. Apparatus for modifying a run-length limited code to delete a DC component therefrom while retaining the run-length limitation, said code being formed of a succession of digital bits arranged in a predetermined format in a series of blocks, a trailing end portion of one of said blocks being contiguous with a leading end portion of a succeeding one of said blocks at a junction between the two blocks, said apparatus comprising:

means for analyzing each of said blocks to determine the presence of a charge accumulation therein, said analyzing means including means for detecting the sense of such accumulations;

means coupled to said analyzing means for modifying the junction between two successive blocks of the code to select a sense of a charge accumulation in at least one of said blocks which counteracts a charge accumulation by another of said blocks; and wherein said modifying means preserves the run-length limitation, said modifying means comprising:

means for providing predetermined sets of substitute end portions for both leading and trailing end portions of a block of said code; and means for inserting additional code bits between a trailing end portion and a leading end portion of a successive ones of said blocks, each said end portions having a predetermined number of bits.

10. Apparatus according to claim 9 further comprising means for restoring said predetermined format to code blocks modified by said modifying means.

11. Apparatus according to claim 10 wherein said analyzing means includes means for determining whether the sense of a charge accumulation in a code block is to be inverted, and said modifying means selects said sense in response to a determination of said determining means, a specific sense of charge accumulation being attained by selection of an appropriate set of end portions from said providing means.

12. Apparatus according to claim 11 wherein said modifying means operates with a set of prescribed arrangements of digital bits at said junction, said prescribed arrangements including said substitute end portions and said additional code bits; and wherein said providing means comprises a memory storing said prescribed arrangements of digital bits, said memory being addressed by addresses composed of the sequence of bits in a leading end portion of a presently occurring block of said code and the sequence of bits in a trailing end portion of a preceding block of said code.

13. Apparatus according to claim 12 wherein said memory provides two sets of said prescribed arrangements for each address, one set of said prescribed arrangements at said address returning a sense of charge accumulation, and a second set of said prescribed arrangements at said address inverting a sense of charge accumulation.

14. Apparatus according to claim 12 wherein said modifying means alters the polarity of at least one bit in an end portion of a code block.

15. Apparatus according to claim 14 wherein said memory provides two sets of said prescribed arrangements for each address, one set of said prescribed arrangements at said address returning a sense of charge accumulation, and a second set of said prescribed arrangements at said address inverting a sense of charge accumulation; and said modifying means includes means responsive to a sense of charge accumulation detected by said detecting means for activating said memory to output one of said two sets of prescribed arrangements at said address.

* * * * *